United States Patent
Guettaf et al.

(10) Patent No.: US 8,074,132 B2
(45) Date of Patent: Dec. 6, 2011

(54) PROTECTING DATA ON INTEGRATED CIRCUIT

(75) Inventors: Amar Guettaf, Sunnyvale, CA (US);
Love Kothari, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 419 days.

(21) Appl. No.: 12/259,903

(22) Filed: Oct. 28, 2008

(65) Prior Publication Data

US 2010/0107023 A1    Apr. 29, 2010

(51) Int. Cl.
*G01R 31/28* (2006.01)
(52) U.S. Cl. ........ 714/726; 714/727; 714/724; 714/733; 714/734; 326/8; 326/16; 713/182; 713/193; 713/194; 711/100; 726/26; 726/27; 726/11; 726/17; 726/21
(58) Field of Classification Search .................. None
See application file for complete search history.

(56) References Cited

U.S. PATENT DOCUMENTS

| | | | | |
|---|---|---|---|---|
| 7,363,564 B2* | 4/2008 | Moss et al. | .................... | 714/734 |
| 7,487,418 B2* | 2/2009 | Kayukawa et al. | ........... | 714/727 |
| 2007/0226562 A1* | 9/2007 | Tkacik et al. | ................. | 714/726 |
| 2008/0010570 A1* | 1/2008 | Yamazaki | ..................... | 714/726 |

OTHER PUBLICATIONS

"IEEE Std 1149.1 (JTAG) Testability", Texas Instruments, Primer 1997 130 pages.
"JTAG (IEEE 1149.1/P1149.4) Tutorial Introductory", TI Test Symposium 1997, 7 pages.

* cited by examiner

*Primary Examiner* — John Trimmings
(74) *Attorney, Agent, or Firm* — Brake Hughes Bellermann LLP

(57) ABSTRACT

Various example embodiments are disclosed. According to one example embodiment, an integrated circuit may include a mode block, a plurality of data blocks, and a reset node. The mode block may be configured to output a test mode signal, a scan mode signal, and a trigger signal based on a received data input. The plurality of data blocks may each include registers configured to store data, each of the plurality of data blocks being configured to write over at least some of the data stored in their respective registers in response to receiving a write-over instruction. The reset node may be configured to reset the registers based on receiving either a first reset input or a second reset input. The integrated circuit may be configured to enter a test mode, enter a scan mode, and exit the test mode.

22 Claims, 3 Drawing Sheets

PROTECTING DATA ON INTEGRATED CIRCUIT

TECHNICAL FIELD

This description relates to protecting data on integrated circuits.

BACKGROUND

Integrated circuits may store secure data that are intended to be kept secret. However, during scanning functions of the integrated circuits, unauthorized persons may access the secure data. It may be desirable to prevent unauthorized access to the secure data.

SUMMARY

The details of one or more implementations are set forth in the accompanying drawings and the description below. Other features will be apparent from the description and drawings, and from the claims.

DETAILED DESCRIPTION

Figure 1:
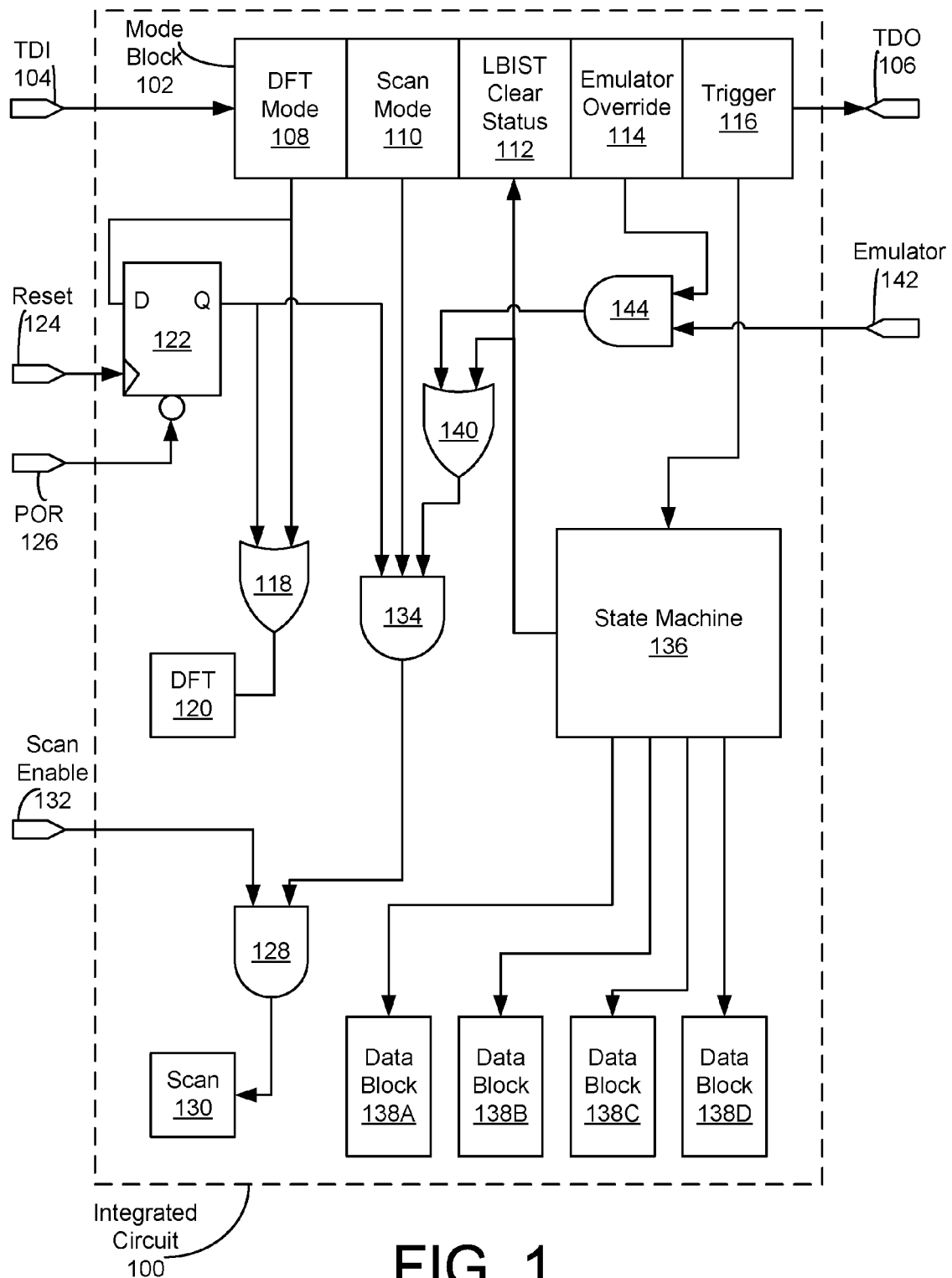
FIG. 1 is a block diagram of an integrated circuit according to an example embodiment.

FIG. 1 is a block diagram of an integrated circuit 100 according to an example embodiment. The integrated circuit 100 may include, for example, an integrated circuit used to store, provide, and control access to secure data, such as security keys, in mobile or wireless devices, digital television or display units, or audio units such as Voice over Internet Protocol (VoIP) telephones.

In an example embodiment, the integrated circuit 100 may be configured to be placed in a test mode or a functional mode. The test mode may be a Design for Test (DFT) mode. The DFT mode may prevent devices in the integrated circuit 100 from performing functions not related to testing or scanning of the integrated circuit. The test mode may include sub-modes, such as a scan mode, a Logic Built In Self Test (LBIST) mode, a Memory Built In Self Test (MBIST) mode, and/or a Joint Test Action Group (JTAG) mode, according to example embodiments.

In the scan mode, the integrated circuit 100 may scan data or logic states stored in flip-flops, such as flip-flops included in registers of the integrated circuit 100. Security keys may be stored in these registers, and may be shifted out of the registers as serial output during the scan mode. During the scan mode, an unauthorized person could apply a probe or other output-detecting device to the output of the flip-flops and/or registers and obtain the security keys.

During the LBIST mode, the integrated circuit 100 may scan the data or logic states stored in flip-flops, and may also scan logic states of logic gates, such as AND gates, OR gates, NOT gates, NAND gates, NOR gates, or XOR gates included in the integrated circuit 100. During the MBIST mode, the integrated circuit 100 may scan memory devices, such as data blocks, included in the integrated circuit 100. During the JTAG mode, the integrated circuit 100 may perform a boundary scan to test interconnects between sub-blocks of the integrated circuit 100.

In an example embodiment, the integrated circuit 100 may be placed in the test mode. After being placed in the test mode, the integrated circuit 100 may be placed in one or more sub-modes. For example, the integrated circuit 100 may be placed in the scan mode after or upon entering the test mode, and after or upon receiving an input or signal from a reset node. The reset node, in addition to allowing the integrated circuit 100 to enter the test mode, may reset devices in the integrated circuit 100. Resetting the devices in the integrated circuit 100 may remove data, such as security keys, from the devices. The integrated circuit 100 may be configured to enter the test mode only after the reset input has caused the devices in the integrated circuit 100 to be reset, thus allowing the integrated circuit to enter the test mode only after the security keys have been deleted from the integrated circuit.

Before entering the scan mode, the integrated circuit 100 may write over data, such as security keys, stored in the integrated circuit. The security keys may include encryption keys used to encrypt and/or decrypt data received by or sent from the integrated circuit 100, or authorization keys used to access data stored in the integrated circuit 100 or gain control of the integrated circuit 100, according to example embodiments. Thus, the integrated circuit 100 may be configured to enter the scan mode only after resetting devices on the integrated circuit 100 and after writing over data, such as security keys, stored on the integrated circuit 100. While in scan mode, the integrated circuit 100 may forbid access to certain memory blocks to prevent data, such as security keys, from being retrieved from the memory blocks while the integrated circuit 100 is in the scan mode.

The integrated circuit 100 may be taken out of the test mode as a result of receiving a second reset input that may reset devices and remove or overwrite data again. Thus, in this example, the integrated circuit 100 may sequentially reset the devices, enter the test mode, write over data, enter the scan mode, exit the scan mode, and reset the devices again before exiting the test mode and entering the functional mode. By performing these functions sequentially, access to sensitive data stored on the integrated circuit can be controlled.

In the example shown in FIG. 1, the integrated circuit 100 may include a mode block 102. The mode block 102 may include electrical circuitry that controls which mode the integrated circuit 100 is in, such as the test mode (or DFT mode) or the functional mode. The mode block 102 also may control which sub-mode of the test modes the integrated circuit 100 is in, such as the scan mode, the Logic Built In Self Test (LBIST) mode, the Memory Built In Self Test (MBIST) mode, and/or the Joint Test Action Group (JTAG) mode, according to example embodiments. In an example embodiment, the mode block 102 may include a JTAG data register.

The mode block 102 may receive input from a test data input (TDI) node 104. The TDI node 104 may receive input from outside the integrated circuit 100. The TDI node 104 may receive test stimulus, such as data to be scanned through the integrated circuit 100.

The mode block 102 may also send output outside the integrated circuit 100 via a test data output (TDO) node 106. The TDO node 106 may provide an output response to the test stimulus provided to the TDI node 104. Data may be scanned from the TDI node 104 to the TDO node 106 through the integrated circuit 100. In an example embodiment, the output of the TDO node 106 may indicate whether the integrated circuit 100 is properly processing data provided to the integrated circuit 100 via the TDI node 104.

The mode block 102 may communicate with other devices within the integrated circuit 100. To facilitate this communication, the mode block 102 may include a plurality of input and/or output blocks. The input or output blocks may receive input from, or provide output to, other devices in the integrated circuit 100. In the example shown in FIG. 1, the mode block 102 may include a DFT mode block 108, a scan mode block 110, a LBIST clear status block 112, an emulator override block 114, and a trigger block 116. Other blocks, such as an MBIST block, may be included in the mode block 102, according to various example embodiments.

In an example embodiment, the DFT mode block 108 may include electrical circuitry configured to cause the integrated circuit 102 to enter the test mode. In the example shown in FIG. 1, the DFT mode block 108 may be coupled to a first input of a test OR gate 118. An output of the test OR gate 118 may be coupled to a DFT block 120. The DFT mode block 108 may, for example, send a test mode signal, such as a '1', to the DFT block 120 via the test OR gate 118. The DFT block 120, when activated, may cause other devices in the integrated circuit 100 to enter the test mode. Thus, the DFT mode block 108 may activate the DFT block 120 and cause the devices in the integrated circuit 100 to enter the test mode. While in the test mode, devices in the integrated circuit 100 may not be functional for functions or processes other than testing functions or processes.

In the example shown in FIG. 1, the DFT mode block 108 may also be coupled to a data input (D) of a flip-flop 122. In this example, the flip-flop 122 may include a positive-edge-triggered D flip-flop with clear. A clock input of the flip-flop 122 may be coupled to a reset node 124 of the integrated circuit 100. The reset node 124 may be coupled to and may be controlled by a device outside the integrated circuit 100, or may be controlled by a user of the integrated circuit 100 or by a user of a device in which the integrated circuit 100 is installed. The reset node 124 may include electrical circuitry configured to assert a reset input or signal, such as a '1', to the clock input of the flip-flop 122, and then to stop asserting the reset input or signal; the flip-flop 122 may interpret the lack of a reset input or signal from the reset node 124 as a '0'. The reset node 124, in addition to providing a reset input or signal to the clock input of the flip-flop 122, may prompt a reset operation by the integrated circuit 100. The reset operation may reset devices in the integrated circuit 100, such as by erasing particular data stored in the devices, such as, for example, secure data such as security keys or encryption keys.

An output node (Q) of the flip-flop 122 may be coupled to a second input of the test OR gate 118. In the example in which the flip-flop 122 includes a positive-edge-triggered D flip-flop, the flip-flop 122 may store the value received from the DFT mode block 108 when the reset node 124 is triggered. The flip-flop 122 may also send a reset input or signal to the clock input of the flip-flop 122, and provide the stored value to the test OR gate 118. This value stored by the flip-flop 122 may not be changed until the flip-flop 122 receives another reset signal from the reset node 124. Thus, if the reset node 124 sends a reset input or signal to the clock input of the flip-flop 122 while the DFT mode block 108 is asserting the test mode signal or '1' to the DFT block 120, the flip-flop 122 will store the test mode signal or '1'. While storing the test mode signal or '1', the flip-flop 122 will assert the test mode signal or '1' to the first test gate 118 until the flip-flop 122 receives another reset input or signal from the reset node 124, at which time the flip-flop 122 will store the new signal then received from the DFT mode block 108. If the flip-flop 122 receives a first reset signal from the reset node 124 while receiving the test mode signal (such as the '1') from the DFT mode block 108, the flip-flop may store the test mode signal or '1' until receiving a second reset signal from the reset node 124 while receiving a different signal (such as the lack of test mode signal or '0') from the DFT mode block 108. Thus, in this example, if the integrated circuit 100 receives the reset signal while in the test mode, the integrated circuit 100 may not leave the test mode until after it receives another reset signal while the DFT block is asserting a different signal (such as the lack of test mode signal or '0') to exit or discontinue the test mode. By resetting devices before the devices leave the test mode and enter an active mode, the integrated circuit 100 may clear any secure data from the registers which could otherwise remain in the registers and be accessed by an unauthorized person or entity while in the active mode.

In the example shown in FIG. 1, the flip-flop 122 may also include a clear input coupled to a power-on reset (POR) input 126. The power-on reset input 126 may be coupled to one or more devices outside the integrated circuit 100, and may provide a reset or clear input to the clear input of the flip-flop 122 when the integrated circuit 100 powers off, such as when power becomes unavailable to the integrated circuit 100. In this example, when power becomes unavailable to the integrated circuit 100, the power-on reset input 126 may provide the reset or clear input to the clear input of the flip-flop 122, thereby causing the flip-flop 122 to store a non-test or '0' value.

The integrated circuit 100 may be placed in a scan mode after entering the test or DFT mode. During the scan mode, data may be shifted in and out of the integrated circuit 100, such as in and out of flip-flops and/or registers included in the integrated circuit 100. In the example shown in FIG. 1, the integrated circuit 100 may include a scan enable AND gate 128 that includes an output coupled to a scan block 130. The scan block 130, when activated by the scan enable AND gate 128, may prompt other devices in the integrated circuit 100 to enter a scan mode. When the integrated circuit 100 is in the scan mode, tests may be performed on one or more devices of the integrated circuit 100 to assess the performance of the devices. For example, an LBIST may be performed while the integrated circuit is in the scan mode.

The scan enable AND gate 128 may have a first input coupled to a scan enable input 132, and the gate 128 may receive input from the scan enable input 132. The scan enable input 132 may receive input from a device outside the integrated circuit 100 or from a user. The scan enable input 132 may provide a scan signal to the scan enable AND gate 128 when prompted by the outside device or the user. However, the scan enable AND gate 128 may only provide the scan signal for the scan block 130 to prompt scanning when the scan enable AND gate 128 also receives a scan signal from a scan mode AND gate 134. This ensures that the integrated circuit 100 does not enter the scan mode until after the integrated circuit 100 enters the test mode, the latter of which requires a reset to occur. By requiring a reset before entering the scan mode, and thereby erasing data stored on devices in the integrated circuit before entering the scan mode, the integrated circuit 100 prevents the data from being scanned out of the devices by someone applying probes to the devices during the scan mode. The data may not be scanned out of the devices during the scan mode because the data have already been erased during the reset before the scan mode.

An output of the scan mode AND gate 134 may be coupled to a second input of the scan enable AND gate 128. Thus, the scan enable AND gate 128 may provide the scan signal to the scan block 130 when the scan enable AND gate 128 receives the scan signals from both the scan enable input 132 and the scan mode AND gate 134.

The scan mode AND gate 134 may have a first input coupled to the output of the flip-flop 122. This input may require that the flip-flop 122 store the test mode signal or '1' for the scan mode AND gate 134 to send the scan signal to the scan enable AND gate 128. If the flip-flop 122 is not storing the test mode signal or '1', then the scan mode AND gate 134 may not provide the scan signal to the scan enable AND gate 128, according to an example embodiment.

The scan mode AND gate 134 may also have a second input coupled to the scan mode block 110 of the mode block 102. The scan mode block 110 may provide a scan mode signal to the scan mode AND gate 134 based on input received via the TDI node 104, or based on input received from a state machine 136, as discussed below. The scan mode block 110 may provide the scan mode signal to the scan mode AND gate 134 as part of a process initiated based on input received via the TDI node 104.

The integrated circuit 100 may include the state machine 136. The state machine 136 may include an independent state machine or a finite state machine, according to example embodiments. The state machine 136 may provide outputs based on successive inputs. In the example shown in FIG. 1, the state machine 136 may provide outputs based on inputs, such as a trigger signal, received from the trigger block 116 of the mode block 102. The trigger signal sent by the trigger block 116 may provide instructions for the state machine 136, such as instructions to provide certain outputs described below. The trigger block 116 may provide the instructions to the state machine based on inputs received by the mode block 102 via the TDI node 104. The trigger block 116 may, for example, provide the instructions to the state machine 136 to facilitate the scan mode after the DFT mode block 108 has sent test mode signals to the test OR gate 118 and the flip-flop 122. This may ensure that the integrated circuit 100 does not enter the scan mode until after entering the test mode, which requires a reset. Thus, the integrated circuit 100 will not enter the scan mode until after the integrated circuit has been reset. Because the reset erases certain data, these data will no longer be available to be scanned out of devices during the scan mode.

The state machine 136 may be coupled to, and provide instructions to, a plurality of data blocks 138A, 138B, 138C, 138D. While four data blocks 138A, 138B, 138C, 138D are included in the example integrated circuit 100 shown in FIG. 1, any number of data blocks may be included in the integrated circuit 100. The data blocks 138A, 138B, 138C, 138D may store data. The data blocks 138A, 138B, 138C, 138D each may include, for example, a plurality of registers that store the data. The data may include security keys.

The state machine 136 may, based on the trigger signal received from the trigger block 116, provide a write-over instruction to any or all of the data blocks 138A, 138B, 138C, 138D. The data blocks 138A, 138B, 138C, 138D may, in response to receiving the write-over instruction, write over or erase the data, such as security keys, stored in their respective registers and logic gates. In example embodiments, the data blocks 138A, 138B. 138C, 138D may write over or erase the data by writing all ones over the data, writing all zeroes over the data, or by writing pseudorandom data over the data, according to example embodiments.

Figure 2:
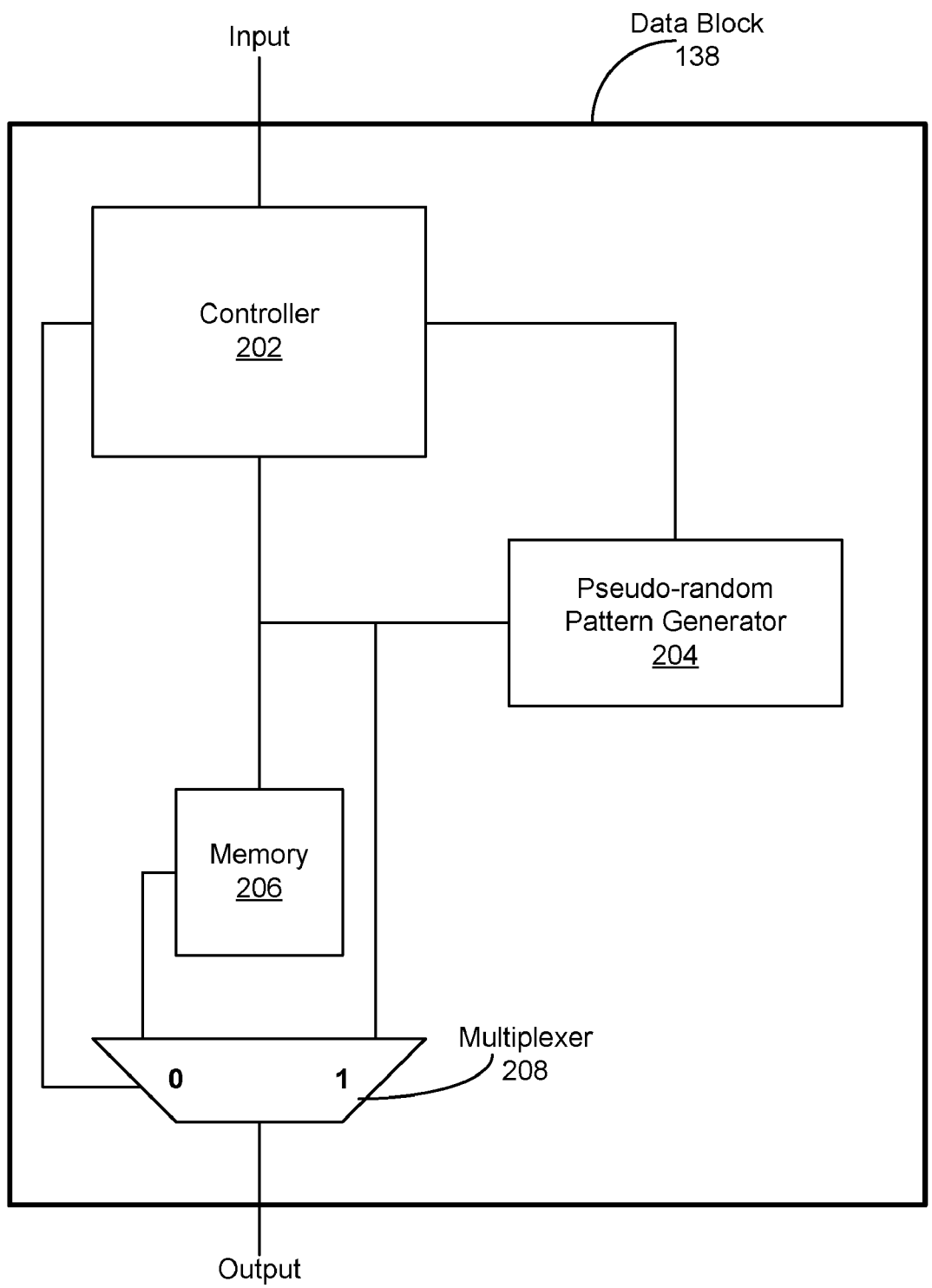
FIG. 2 is a block diagram of a data block according to an example embodiment.

FIG. 2 is a block diagram of a data block 138 according to an example embodiment. In this example, the data block 138 may receive input from the state machine 136. The data block 138 may include a controller 202 that receives the input. The controller 202 may include a processor capable of receiving and executing instructions, such as instructions received from the state machine 136. The controller 202 may receive instructions to write over the data, such as the security keys. The controller 202 may instruct a pseudo-random pattern generator 204 to write pseudo-random data over data stored in a memory 206 based on receiving the write-over instruction. The memory 206 may include the registers that store the data or security keys. In an example embodiment, data may be shifted in and out of the registers included in the memory 206. The controller 202 may also write zeroes or ones over the data stored in the registers of the memory 206 based on receiving the write-over instruction.

The controller 202 may also cause the data block 138 to output data from the memory 206, or to bypass the memory 206 and output data from the controller 202, in accordance with instructions received from the state machine 136. The controller 202 may bypass the memory 206 by controlling a multiplexer 208 that includes an input coupled to each of the memory 206 and the controller 202. The controller 202 may determine whether the multiplexer 208 receives input from the memory 206 or from the controller 202. If the controller 202 causes the multiplexer 208 to receive its input from the controller 202 rather than the memory 206, then the memory 206 may be considered to be bypassed. The controller 202 may cause the multiplexer 208 to receive its input from the controller and bypass the memory 206 during the scan mode, thereby making data stored in the memory 206, such as security keys or encryption keys, unavailable to a person or entity which may be able to probe or detect data output by the memory 208 or multiplexer 208. For example, during a scan function, the controller 202 may bypass the memory 206 to prevent security keys from being scanned from the registers included in the memory 206. The output of the data block 138 may be coupled to another device within or outside to the integrated circuit 100.

Returning to FIG. 1, after sending the write-over instruction to the data blocks 138A, 138B, 138C, 138D, the state machine 136 may send a delayed scan enable instruction to the LBIST clear status block 112 and to a third input of the scan mode AND gate 134 via a first input of a scan OR gate 140. The LBIST clear status block 112 may receive the input from the state machine 136 indicating that the data blocks 138A, 138B, 138C, 138D have received and completed the write-over instruction from the state machine 136. The scan mode block 110 may provide the scan signal to the scan mode AND gate 134 based on the LBIST clear status block 112 receiving the delayed scan enable instruction or signal from the state machine 136, according to an example embodiment.

An output of the scan OR gate 140 may be coupled to the third input of the scan mode AND gate 134. The state machine 136 may send the delayed scan enable instruction after sending the write-over instruction to the data blocks 138A, 138B, 138C, 138D. In this example, the scan block 130 may receive the scan signal from the scan enable AND gate 128, after the reset node 124 has reset the devices in the integrated circuit 100, and after the data blocks 138A, 138B, 138C, 138D have written over the data stored in their respective registers based on receiving the write-over instruction from the state machine 136, thereby prompting the integrated circuit 100 to enter the scan mode. Thus, in this example, the integrated circuit 100 may enter the scan mode only after the secure data have been erased during the reset and after the secure data stored in the registers of the data blocks 138A, 138B, 138C, 138D have been written over. The integrated circuit 100 may exit the scan mode when the scan enable node 132 stops asserting the scan signal, when the flip-flop 122 stops storing the test mode signal or '1', when the scan mode block 110 stops asserting the scan signal, or when the state machine 136 stops providing the delayed scan enable instruction, according to an example embodiment. Thus, if the integrated circuit 100 exits the test mode (which may require a reset), the integrated circuit 100 will also exit the scan mode; the integrated circuit 100 may not be in the scan mode without also being in the test mode. The integrated circuit 100 may, however, exit the scan mode while remaining in the test mode.

In an example embodiment, the integrated circuit 100 may include an emulator node 142. The emulator node 142 may be coupled to a device outside the integrated circuit 100, or be controlled by a user, or be tied to a one-time programmable memory bit which can be programmed before distributing the integrated circuit 100. The emulator node 142, in conjunction with the emulator override block 114, may provide inputs to an emulator AND gate 144, and may allow the integrated circuit 100 to be tested during manufacturing or testing. The emulator AND gate 144 may have an output that provides a signal to a second input of the scan OR gate 140. By providing the input to the scan OR gate 140, the emulator node 142 and the emulator override block 114 may allow the integrated circuit 100 to enter the scan mode without involving the state machine 136, and without providing the write-over instruction to the data blocks 138A, 138B, 138C, 138D. This may allow a manufacturer of the integrated circuit 100 to scan the integrated circuit 100 without incurring the processing overhead associated with the write-over instruction. In an example embodiment, the emulator node 142 and/or emulator override block 114 may be disabled by the manufacturer before distributing the integrated circuit 100. By disabling the emulator node 142 and/or emulator override block 114, the manufacturer may prevent downstream users from causing the integrated circuit 100 to enter the scan mode without the state machine 136 first providing the write-over instruction to the data blocks 138A, 138B, 138C, 138D.

Figure 3:
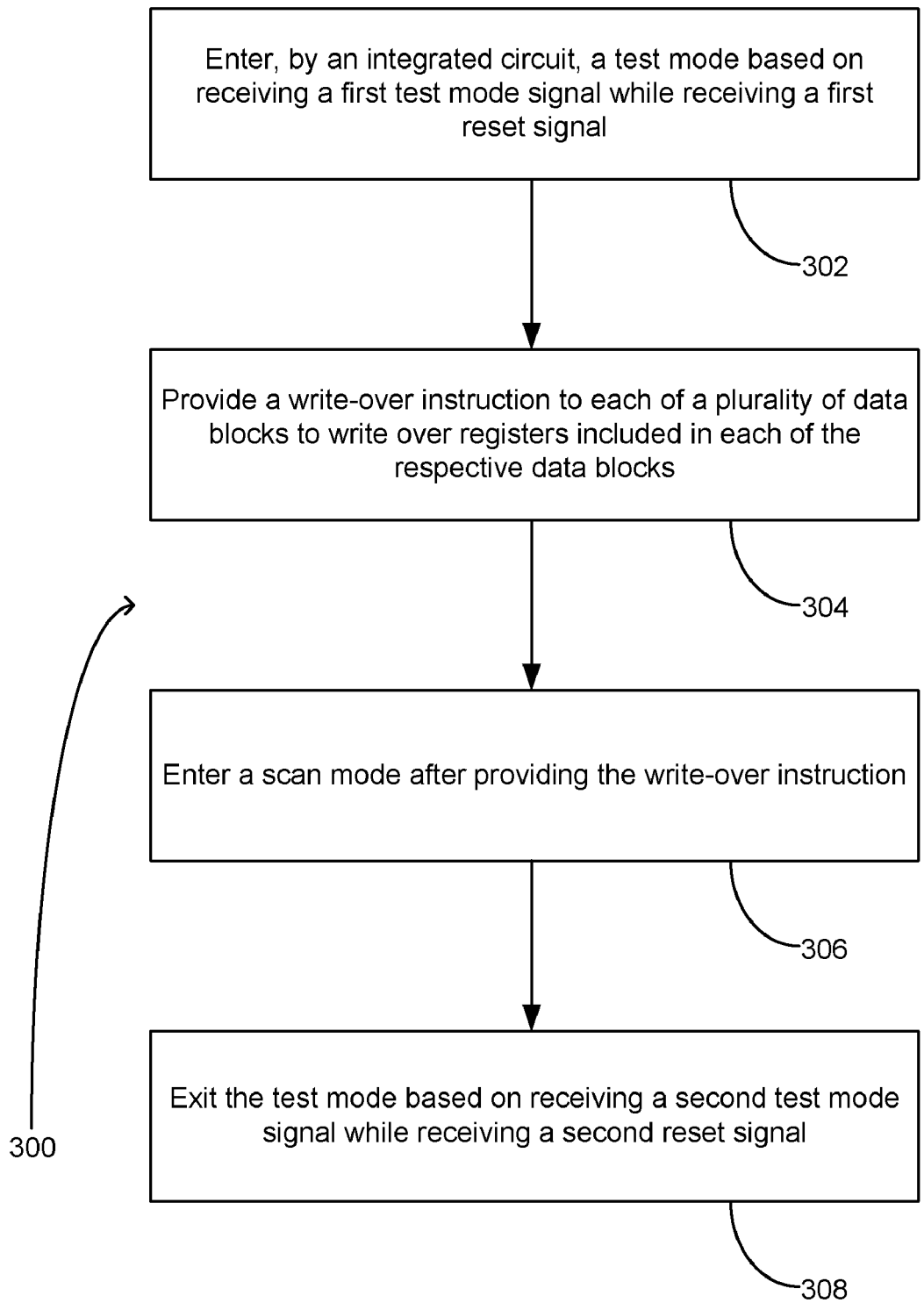
FIG. 3 is a flowchart showing a method according to an example embodiment.

FIG. 3 is a flowchart showing a method 300 according to an example embodiment. In this example, the method 300 may include entering, by an integrated circuit 102, a test mode based on receiving a first test mode signal while receiving a first reset signal (302). The method 300 may also include providing a write-over instruction to each of a plurality of data blocks 138A, 138B, 138C, 138D to write over registers included in each of the respective data blocks 138A, 138B, 138C, 138D (304). The method 300 may also include entering a scan mode after providing the write-over instruction (306). The method 300 may also include exiting the test mode based on receiving a second test mode signal while receiving a second reset signal (308).

In an example embodiment, the providing the write-over instruction may include providing the write-over instruction to each of the plurality of data blocks 138A, 138B, 138C, 138D based on receiving a trigger signal from a Joint Test Action Group (JTAG) data register.

In an example embodiment, the providing the write-over instruction to each of the plurality of data blocks 138A, 138B, 138C, 138D may include providing, by a state machine 136, the write-over instruction to each of the plurality of data blocks 138A, 138B, 138C, 138D. In this example, the entering the scan mode may include entering the scan mode based on receiving a delayed scan enable instruction from the state machine 136.

In an example embodiment, the entering the scan mode may include instructing each of the plurality of data blocks 138A, 138B, 138C, 138D to perform a Logic Built In Self Test (LBIST), the LBIST including bypassing memory blocks 206 included in the respective data blocks 138A, 138B, 138C, 138D.

In an example embodiment, the scan mode may include shifting data in and out of the registers included in the data blocks 138A, 138B, 138C, 138D.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, which may implement the processes described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An integrated circuit comprising:
   a mode block configured to assert a test mode signal, a scan mode signal, and a trigger signal based on a received data input;
   a plurality of data blocks each including registers configured to store data, each of the plurality of data blocks being configured to write over at least some of the data stored in their respective registers in response to receiving a write-over instruction; and
   a reset node configured to reset the registers based on receiving either a first reset input or a second reset input;
   wherein the integrated circuit is configured to enter a test mode based on the test mode signal;
   wherein the integrated circuit is configured to enter a scan mode based on:
      a delayed scan enable instruction, the delayed scan enable instruction being provided by the integrated circuit after the integrated circuit provides the write-over instruction to each of the plurality of data blocks to write over their respective registers, the integrated circuit providing the write-over instruction based on the trigger signal;
      the scan mode signal; and
      the test mode signal when the reset input node receives the first reset input; and
   wherein the integrated circuit is configured to exit the test mode based on the mode block not outputting the test mode signal when the reset input node receives the second reset input.

2. The integrated circuit of claim 1, wherein the mode block includes a Joint Test Action Group (JTAG) data register.

3. The integrated circuit of claim 1, wherein each of the plurality of data blocks is configured to erase data stored in their respective registers in response to receiving the write-over instruction.

4. The integrated circuit of claim 1, wherein each of the plurality of data blocks is configured to scramble at least some of the data stored in their respective registers in response to receiving the write-over instruction.

5. The integrated circuit of claim 1, wherein each of the plurality of data blocks includes a state machine configured to write over the data stored in the registers in response to receiving the write-over instruction.

6. The integrated circuit of claim 1, wherein the integrated circuit is configured to enter the test mode, the test mode including a Design for Test (DFT) mode.

7. The integrated circuit of claim 1, wherein the integrated circuit is configured to enter the scan mode, the scan mode including performing a Logic Built In Self Test (LBIST).

8. The integrated circuit of claim 1, wherein the integrated circuit is further configured to instruct each of the plurality of data blocks to bypass their respective registers while the integrated circuit is in the scan mode.

9. The integrated circuit of claim 1, further comprising:
   a scan enable input,
   wherein the integrated circuit is configured to enter the scan mode based on:
      the delayed scan enable instruction, the delayed scan enable instruction being provided by the integrated circuit after the integrated circuit provides the write-over instruction to each of the plurality of data blocks to write over their respective registers, the integrated circuit providing the write-over instruction based on the trigger signal;
      the scan mode signal;
      the test mode output signal when the reset input node receives the reset input; and
      a scan enable signal received from the scan enable input.

10. The integrated circuit of claim 1, wherein the integrated circuit is configured to shift data in and out of the registers during the scan mode.

11. The integrated circuit of claim 1, further comprising a state machine configured to receive the trigger signal, send the scramble instruction to each of the data blocks based on receiving the trigger output, and output the delayed scan enable instruction after sending the scramble instruction.

12. The integrated circuit of claim 1, further comprising a flip-flop, the flip-flop including a data input configured to receive the test mode signal from the mode block, a clock input coupled to the reset node, and an output node coupled to each of a test node and a scan enable node via at least one logic gate.

13. The integrated circuit of claim 1, further comprising:
   a flip-flop, the flip-flop including a data input configured to receive the test mode signal from the mode block;
   a clock input coupled to the reset node; and
   an output node coupled to a test node via at least an OR gate and to a scan enable node via at least an AND gate.

14. A method comprising:
   entering, by an integrated circuit, a test mode based on receiving a test mode signal while receiving a first reset signal;
   providing a write-over instruction to each of a plurality of data blocks to write over registers included in each of the respective data blocks after entering the test mode;
   entering a scan mode after providing the write-over instruction; and
   exiting the test mode based on not receiving the test mode signal while receiving a second reset signal,
   wherein the providing the write-over instruction includes providing the write-over instruction to each of the plurality of data blocks based on receiving a trigger signal from a Joint Test Action Group (JTAG) data register.

15. The method of claim 14, wherein the scan mode includes shifting data in and out of the registers included in the data blocks.

16. An integrated circuit comprising:
   a Joint Test Action Group (JTAG) data register including an input node, a test mode output node, a scan mode output node, and a trigger output node, the JTAG data register being configured to output, via the respective output nodes based on receiving an input via the input node, a test mode signal to a data input of a flip-flop and to a first input node of a test OR gate, a scan mode signal to a first input node of a scan mode AND gate, and a trigger signal to an input of a state machine;
   the test OR gate comprising the first input node, a second input node, and an output node, the test OR gate being configured to provide a test OR gate signal to a test mode input node via its output node based on receiving either the test mode signal from the test mode output node of the JTAG data register via its first input node or an output signal from the flip-flop via its second input node;
   the flip-flop comprising a data input node, a clock input node, and an output node, the flip-flop being configured to send a flip-flop signal to the second input node of the test OR gate and to a second input node of the scan mode AND gate based on receiving the test mode signal from the test mode output node via its data input at a same time as receiving a reset signal from a reset node via its clock input;

the reset node configured to provide the reset input to the clock input of the flip-flop;

the state machine comprising the input node, a plurality of data block output nodes, and delayed scan output node, the state machine being configured to:
provide a write-over instruction to each of a plurality of data blocks via its plurality of data block output nodes based on receiving the trigger signal from the trigger output node of the JTAG data register via its input; and
provide a delayed scan output to a third input node of the scan mode AND gate after providing the write-over instruction;

the plurality of data blocks, each of the plurality of data blocks including registers configured to store data, the plurality of data blocks each being configured to write over at least some of the data stored in their respective registers based on receiving the write-over instruction from the state machine;

the scan mode AND gate, the scan mode AND gate including the first input node, the second input node, the third input node, and the output node, the scan mode AND gate being configured to provide a scan mode AND gate output to a first input of a scan enable AND gate via its output node based on receiving the signals from the scan mode output node, the flip-flop, and the state machine;

the scan enable AND gate, the scan enable AND gate including the first input node, a second output node, and an output node, the scan enable AND gate being configured to provide a scan mode AND gate output to a scan enable node based on receiving the output from the scan mode AND gate via its first input node and a scan enable signal from a scan enable node via its second input node; and the scan enable node configured to provide the scan enable signal to the second input node of the scan enable AND gate.

17. The integrated circuit of claim 16, further comprising:
a scan OR gate including an input node coupled to the delayed scan output node of the state machine and an output node coupled to the third input node of the scan mode AND gate,
wherein the state machine is configured to provide the delayed scan output to the third input node of the scan mode AND gate via the scan OR gate.

18. An integrated circuit comprising:
a mode block configured to assert a test mode signal, a scan mode signal, and a trigger signal based on a received data input;

wherein the integrated circuit is configured to:
enter a test mode based on the test mode signal; and
enter a scan mode based on:
a delayed scan enable instruction, the delayed scan enable instruction being provided by the integrated circuit based on the trigger signal;
the scan mode signal; and
the test mode signal.

19. A method comprising:
entering, by an integrated circuit, a test mode based on receiving a test mode signal while receiving a first reset signal;
providing a write-over instruction to each of a plurality of data blocks to write over registers included in each of the respective data blocks after entering the test mode;
entering a scan mode after providing the write-over instruction; and
exiting the test mode based on not receiving the mode signal while receiving a second reset signal,
wherein the entering the scan mode includes instructing each of the plurality of data blocks to perform a Logic Built In Self Test (LBIST), the LBIST including bypassing memory blocks included in the respective data blocks.

20. An integrated circuit comprising:
a test block configured to assert a test signal;
a plurality of registers configured to store data; and
a reset node configured to reset the registers based on receiving either a first reset input or a second reset input;
wherein the integrated circuit is configured to enter a test mode based on receiving the first reset input while the test signal is asserted and exit the test mode based on receiving the second reset input while the test signal is de-asserted.

21. The integrated circuit of claim 20, wherein:
the integrated circuit is configured to enter a scan mode based on receiving an input from outside the integrated circuit; and
the integrated circuit is configured to enter the scan mode only after resetting the registers.

22. The integrated circuit of claim 21, wherein:
the plurality of registers are included in data blocks; and
the data blocks are configured to bypass the registers and provide output from a controller while in the scan mode.

* * * * *